(12) United States Patent
Bhowmik et al.

(10) Patent No.: US 7,675,333 B2
(45) Date of Patent: Mar. 9, 2010

(54) MULTI-PHASE DELAY LOCKED LOOP WITH EQUALLY-SPACED PHASES OVER A WIDE FREQUENCY RANGE AND METHOD THEREOF

(75) Inventors: Prasenjit Bhowmik, Agartala (IN); Sundararajan Krishnan, Bangalore (IN); Sriram Ganesan, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 11/760,782

(22) Filed: Jun. 10, 2007

(65) Prior Publication Data

US 2007/0285138 A1    Dec. 13, 2007

(51) Int. Cl.
*H03L 7/06* (2006.01)
(52) U.S. Cl. .................. 327/158; 327/159; 327/161
(58) Field of Classification Search .................. 327/158
See application file for complete search history.

(56) References Cited

U.S. PATENT DOCUMENTS

| | | | |
|---|---|---|---|
| 5,220,326 A | 6/1993 | Ledzius et al. | |
| 5,387,914 A | 2/1995 | Mangelsdorf | |
| 6,535,157 B1 | 3/2003 | Garrity et al. | |
| 6,661,214 B1 | 12/2003 | Hann et al. | |
| 6,825,790 B2 | 11/2004 | Chou | |
| 6,891,493 B2 | 5/2005 | Whittaker et al. | |
| 6,963,300 B1 | 11/2005 | Lee | |
| 7,158,443 B2 | 1/2007 | Lin | |
| 7,202,721 B2 * | 4/2007 | Jeon | 327/158 |
| 7,248,199 B2 | 7/2007 | Asano et al. | |
| 7,253,686 B2 | 8/2007 | Ali | |
| 7,285,996 B2 | 10/2007 | Fiedler | |
| 2005/0212575 A1 | 9/2005 | Kim | |
| 2007/0030753 A1 | 2/2007 | Kwak | |
| 2007/0046345 A1 | 3/2007 | Tai et al. | |
| 2008/0042704 A1 * | 2/2008 | Na | 327/158 |
| 2008/0054963 A1 | 3/2008 | Masenas | |

FOREIGN PATENT DOCUMENTS

| | | | |
|---|---|---|---|
| EP | 1276240 A2 * | 1/2003 | |
| WO | WO 99/63414 | 12/1999 | |

* cited by examiner

*Primary Examiner*—Lincoln Donovan
*Assistant Examiner*—Daniel Rojas
(74) *Attorney, Agent, or Firm*—Kanika Radhakrishnan; Evergreen Valley Law Group, P.C.

(57) ABSTRACT

A Delay Locked Loop (DLL) and method for generating multiple equally spaced phases over a wide frequency range is disclosed. The DLL includes a delay line, and a control module. The delay line receives a reference clock signal and outputs a final delay clock signal in response to the reference clock signal. The delay line includes a plurality of delay cells connected in series. The plurality of delay cells generate a plurality of delay clock signals having equally spaced phases. The control module generates a phase control signal based on counting a number of pulses of the reference clock signal that are input to the delay line before occurrence of a first corresponding pulse of the final delay clock signal.

13 Claims, 7 Drawing Sheets

FIG. 7

MULTI-PHASE DELAY LOCKED LOOP WITH EQUALLY-SPACED PHASES OVER A WIDE FREQUENCY RANGE AND METHOD THEREOF

CROSS-REFERENCE TO RELATED APPLICATIONS

This application claims priority to Indian Provisional Patent Application No. 1007/CHE/2006, filed Jun. 9, 2006, and Indian Non-Provisional Patent Application No. E-2/113/2007, filed Jun. 8, 2007, which are incorporated herein by reference.

BACKGROUND

1. Technical Field

Embodiments of the invention relate generally to Delay Locked Loops (DLLs) and more particularly to multiple phase delay locked loops with equal-spaced phase outputs.

2. Prior Art

Multiple phase DLLs are used in a wide variety of electronic applications such as clock and data recovery, frequency synthesis, and generation of clock pulses for sampling in high speed Analog-to-Digital Converters (ADCs). For optimal use in such a wide variety of applications, it is desirable for the DLL to have a broad frequency range of operation. However, the frequency range over which the DLL can be operated, is limited by a delay range that is supported by a delay line of the DLL.

Some of the existing multiphase DLLs that work over a wide frequency range of operation use a dual loop design. In the dual loop design, a coarse control loop can significantly change the delay line's delay and a fine control loop with a small delay range then produces the required delay. However, the coarse control loop is implemented by digitally switching delay elements of the delay line, which considerably increases the power consumption of the DLL. Further, such implementations involve significant increase in die area.

Another existing technique for generating multiple phases uses a small number of delay elements or cells to generate a few phases. The other required phases are obtained by interpolating between these phases. However, the use of interpolation techniques for generating multiple phases result in low slew rates of clock outputs of the delay cells. So the DLL clock outputs are susceptible to noise and jitter.

SUMMARY

Embodiments of the invention described herein provide a Delay Locked Loop (DLL) with equally spaced multiple phases over a wide frequency range and methods thereof.

In an embodiment of the invention, generating multiple phases of a reference clock signal for wide frequency range is achieved by locking to n cycles of the reference clock signal where n is co prime to a number of required clock signal phases. Locking to the n cycles of the reference clock signal is implemented by dividing the reference clock signal and a final delayed clock signal from the delay line and giving these two signals to the Phase Frequency Detector (PFD). The delay line still gets undivided reference clock as its input. Depending on the coprime number, unique mapping of the existing phases of the DLL to the required phases is done to ensure the availability of the required phases. The value of n may be different for different range of reference clock signal.

In accordance with an embodiment of the invention, a Delay Locked Loop (DLL) with equally spaced phases over wide frequency range is provided. The DLL includes a delay line, and a control module. The delay line receives a reference clock signal and outputs a final delay clock signal in response to the reference clock signal. The delay line includes a plurality of delay cells connected in series. The plurality of delay cells generate a plurality of delay clock signals having equally spaced phases. The control module is coupled to the delay line. The control module generates a phase control signal based on counting a number of pulses of the reference clock signal that are input to the delay line before occurrence of a first corresponding pulse of the final delay clock signal.

In accordance with another embodiment of the invention, a Delay Locked Loop (DLL) with equally spaced phases over wide frequency range is provided. The DLL receives a reference clock signal and outputs a plurality of delay clock signals such that a phase difference between any two adjacent delay clock signals of the plurality of delay clock signals is equal. The plurality of delay clock signals include a final delay clock signal. The DLL includes a masking module, a counter, a decoder, a divider module, a Phase Frequency Detector (PFD), a charge pump, and a delay line. The masking module masks a pre-defined number of edges of the reference clock signal and the final delay clock signal, and generates a start_count signal and a stop_count signal upon masking the pre-defined number of edges of the reference clock signal and the final delay clock signal respectively. The counter is coupled to the masking module. The counter generates a count of a number of pulses of the reference clock signal that are input to the delay line between inputting a pulse of the reference clock signal to the delay line and occurrence of a corresponding pulse of the final delay clock signal. The decoder is coupled to the counter. The decoder decodes the count to generate a co-prime number with respect to a number of delay clock signals in the plurality of delay clock signals. The divider module is coupled to the decoder. The divider module receives a value of the co-prime number, and divides frequencies of the reference clock signal and the final delay clock signal by the co-prime number to generate a reference phase signal and a delay phase signal respectively. The Phase Frequency Detector (PFD) is coupled to the divider module, and compares the reference phase signal and the delay phase signal in terms of phase. The charge pump is coupled to the PFD, and generates a phase control signal based on comparing the reference phase signal and the delay phase signal. The delay line is coupled to the charge pump. The delay line includes a plurality of delay cells connected in series. The plurality of delay cells generates the plurality of delay clock signals on receiving the phase control signal. Depending on the coprime number, unique mapping of the existing phases of the DLL to the required phases can be done In accordance with another embodiment of the invention, a method for generating a plurality of equal-spaced phases over wide frequency range using a Delay Locked Loop (DLL) is provided. The DLL includes a plurality of delay cells connected in series. The plurality of delay cells generates a plurality of delay clock signals in response to a reference clock signal. The plurality of delay clock signals includes a final delay clock signal. The method includes generating a co-prime number with respect to a number of delay clock signals in the plurality of delay clock signals, dividing a frequency of the reference clock signal and the final delay clock signal by the co-prime number to generate a reference phase signal and a delay phase signal respectively, comparing phases of the reference phase signal and the delay phase signal, generating a phase control signal based on comparing the phases, and controlling the phase difference between any two adjacent delay clock signals of the plurality of delay clock signals through the phase control signal. Depending on the coprime number, unique mapping of the existing phases of the DLL to the required phases can be done.

This summary is not intended to describe each embodiment of the invention. The Detailed description and Figures that follow provide additional aspects of embodiments of the invention.

DETAILED DESCRIPTION OF THE EMBODIMENTS

Embodiments of the invention provide a multiple-phase Delay Locked Loop (DLL) with an increased input frequency range of operation, equally spaced phase outputs, and methods thereof.

Figure 1:
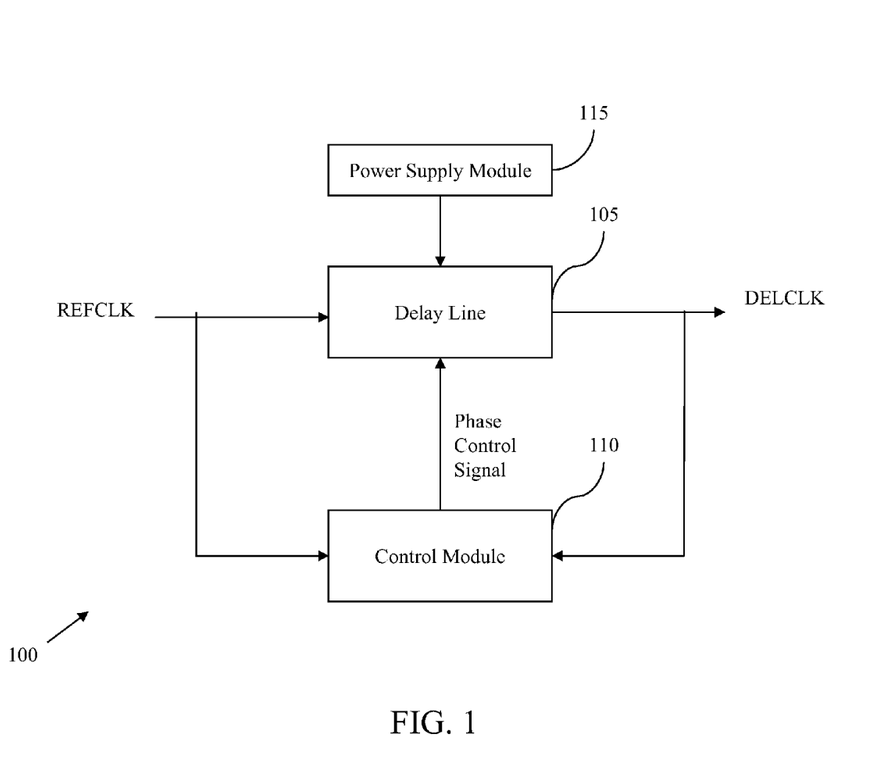
FIG. 1 is a block diagram illustrating a Delay Locked Loop (DLL) in accordance with an embodiment of the invention.

FIG. 1 is a block diagram illustrating a Delay Locked Loop (DLL) 100 in accordance with an embodiment of the invention. The DLL 100 includes a delay line 105, a control module 110, and a power supply module 115. The delay line 105 receives a reference clock signal 'REFCLK' at its input, and outputs a final delay clock signal 'DELCLK' in response to the REFCLK. The control module 110 is coupled to the delay line 105. The control module 110 receives the REFCLK and DELCLK, and generates a phase control signal. The phase control signal is generated based on a count of number of pulses of the REFCLK that occur before a first corresponding pulse of the DELCLK. The power supply module 115 such as a Low Drop Out (LDO) regulator provides power to the delay line 105. The delay line 105 is explained in details in conjunction with FIG. 2.

Figure 2:
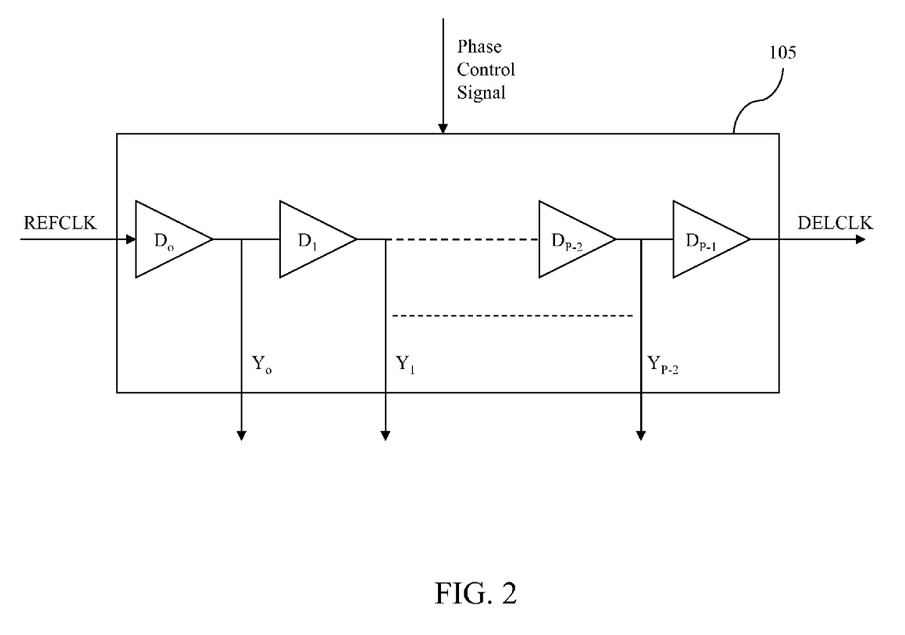
FIG. 2 is a schematic circuit diagram of a delay line in accordance with an embodiment of the invention.

FIG. 2 is a schematic circuit diagram of the delay line 105 in accordance with an embodiment of the invention. The delay line 105 includes multiple identical delay cells connected in series, for example delay cells $\{D_0, D_1, D_2, \ldots, D_{P-1}\}$, i.e., the delay line 105 includes P delay cells, where P is an integer greater than one. The delay cells $\{D_0, D_1, D_2, \ldots, D_{P-1}\}$ output respective delay clock signals $\{Y_0, Y_1, \ldots, Y_{P-2}, DELCLK\}$. For example, the delay cell $D_0$ receives the REFCLK and generates a first delay clock signal $Y_0$, which is then input to $D_1$. Similarly, the delay clock signal from each delay cell of the delay line 105 is input to a subsequent delay cell of the delay line 105, thus generating delay clock signals $\{Y_0, Y_1, \ldots, Y_{P-2}, DELCLK\}$. The delay clock signals so generated differ in phase from one another, i.e., a delay clock signal can either lead or lag in phase from any adjacent delay clock signal. The phase difference between any two adjacent delay clock signals is equal, i.e., the delay clock signals have equal-spaced phases. In an embodiment of the invention, the generated phases are spaced at 2*pi/P. For example, if P=10, the phases will be 36 degrees apart, i.e., 36, 72, 108, 144 . . . 360.

In an embodiment of the invention, the plurality of delay cells may be identical.

Figure 3:
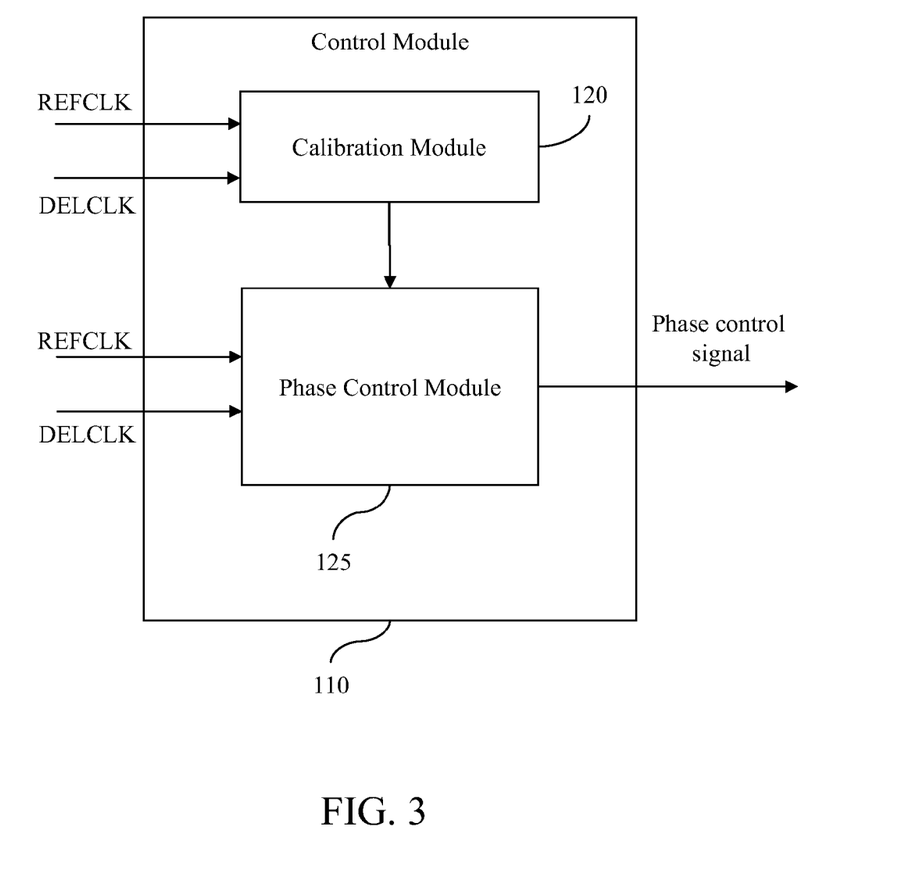
FIG. 3 is a block diagram illustrating a control module in accordance with an embodiment of the invention.

FIG. 3 is a block diagram illustrating the control module 110 in accordance with an embodiment of the invention. The control module 110 includes a calibration module 120 and a phase control module 125. The calibration module 120 generates a co-prime number with respect to number of the delay clock signals, i.e., P. For doing so, the calibration module 120 generates the count of REFCLK pulses that occur before the first corresponding DELCLK pulse to calibrate the phase control signal. The phase control module 125 is coupled to the calibration module 120, and generates the phase control signal based on a value of the co-prime number.

Figure 4:
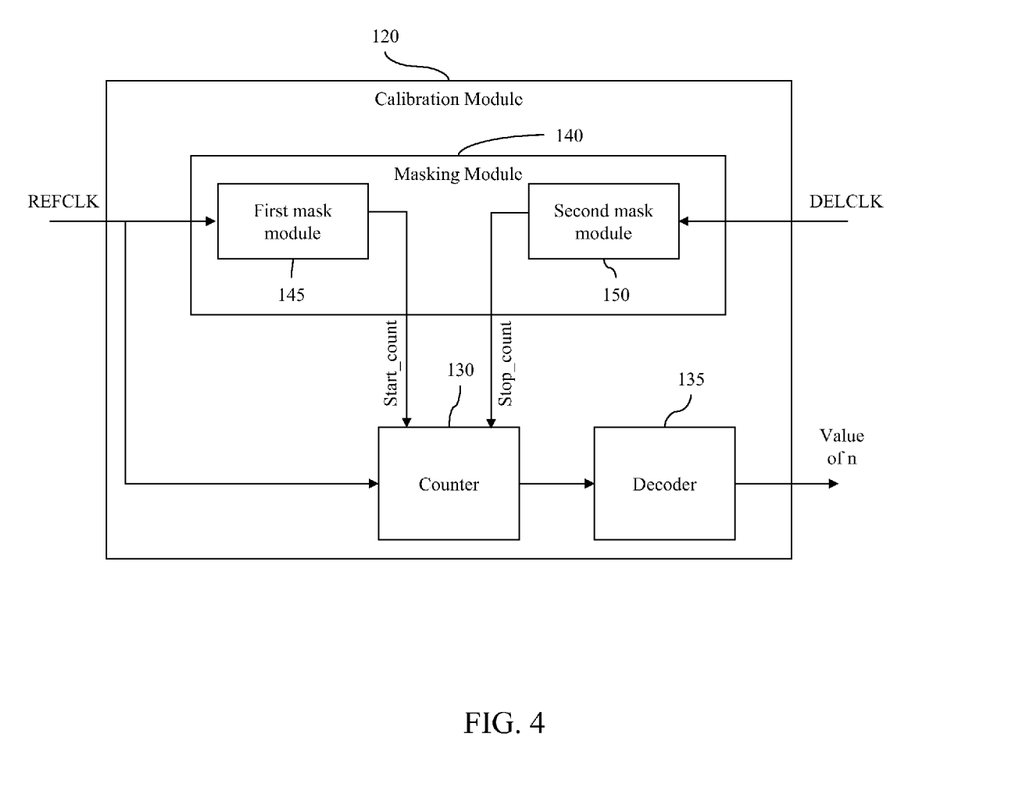
FIG. 4 is a block diagram illustrating a calibration module in accordance with an embodiment of the invention.

FIG. 4 is a block diagram illustrating the calibration module 120 in accordance with an embodiment of the invention. In one embodiment of the invention, the calibration module 120 includes a counter 130 and a decoder 135. The counter 130 counts the number of REFCLK pulses before the first corresponding DELCLK pulse appears at the output of the delay cell $D_{P-1}$, for example, the counter 130 counts the number of the REFCLK pulses till the appearance of the first DELCLK pulse at the output of $D_{P-1}$. The decoder 135 decodes the count generated by the counter 130 to obtain a value of the count. If the count value is a number that is co-prime to P, i.e., does not have any common factor with P, the decoder 135 outputs the count value as 'n'. However, if the count value is not co-prime to P, the decoder 135 selects a next number greater than the count value that is co-prime to P. The decoder then outputs this value as n. The value of n is provided to the phase control module 125.

In another embodiment of the invention, the calibration module 120 also includes a masking module 140. The masking module 140 includes a first mask module 145 and a second mask module 150. Examples of the masking module 140 include, but are not limited to digital counters. The first mask module 145 masks edges of the REFCLK and the second mask module 150 masks the DELCLK edges. This embodiment takes care of a supply transient of the power supply module 115. For this purpose, the masking module 140 masks the REFCLK and DELCLK edges till the power output from the power supply module 115 to the delay line 105 reaches a steady state. In one embodiment, the masking module 140 masks the REFCLK and DELCLK edges for a pre-defined time interval.

In another embodiment, the masking module 140 masks a pre-defined number of edges of the REFCLK and DELCLK. For example, if the masking module masks 'M' number of edges of the REFCLK and DELCLK, then on completion of the masking process, the first mask module 145 sends a 'start_count' signal to the counter 130. On receiving the start_count signal, the counter 130 begins the counting from the REFCLK pulse that occurs at the $(M+1)^{th}$ REFCLK edge at the $D_o$ input. The counting is continued till the $(M+1)^{th}$ DELCLK edge occurs at the $D_{P-1}$ output. On occurrence of the $(M+1)^{th}$ DELCLK edge, the second mask module 150 sends a 'stop_count' signal to the counter 130 to stop the counting. Therefore, for a particular REFCLK edge, the number of REFCLK pulses is counted from that REFCLK edge till the corresponding DELCLK pulse appears at the output of the delay cell $D_{P-1}$. The values of the pre-defined time interval and the pre-defined number of edges depend on the time taken by the power output from the power supply module 115 to reach the steady state.

The n-value generated by the control module 120 is received by the phase control module 125. The phase control module 125 is explained in details in conjunction with FIG. 5.

Figure 5:
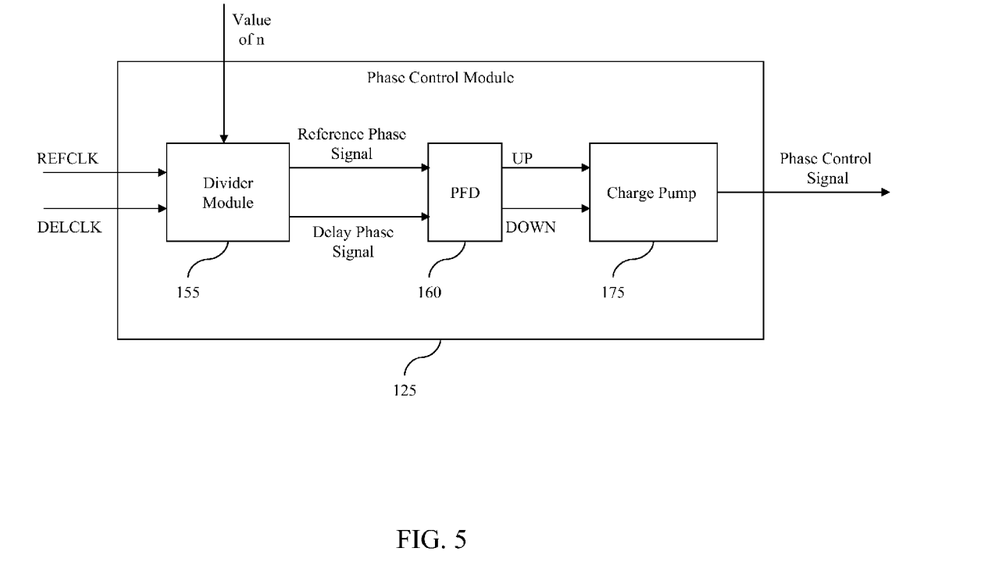
FIG. 5 is a block diagram illustrating a phase control module in accordance with an embodiment of the invention.

FIG. 5 is a block diagram illustrating the phase control module 125 in accordance with an embodiment of the invention. The phase control module 125 includes a divider module 155, a Phase Frequency Detector (PFD) 160, and a charge pump 165. The divider module 155 divides the REFCLK and DELCLK frequencies by a factor of n. Reducing the REFCLK and DELCLK frequencies by n further ensures that the PFD 160 is operated in the phase range of $-2\pi$ to $+2\pi$ radians, where $\pi$~3.142. The PFD 160 compares the phases of the reference phase signal and delay phase signal and generates signals 'UP' or 'DOWN' based on the comparison. For example, if the reference phase signal leads the delay phase signal in phase, the UP signal is generated, and if the reference phase signal lags the delay phase signal in phase, the DOWN signal is generated. The UP or DOWN signal is received by the charge pump 165. The charge pump 165 generates the phase control signal based on the UP/DOWN signal The phase control signal is then provided to each delay cell of the delay line 105. The phase control signal controls the delay in the delay line 105 till corresponding edges of the reference phase signal and the delay phase signal are aligned, i.e., the phase delay or difference between the reference phase signal and the delay phase signal is 0 or 360 degrees. However, the phase control signal delays DELCLK by '$nT_{REF}$' in time, where $T_{REF}$ is the time period of REFCLK. Further, since n is co-prime to the number of delay clock signals, P delay clock signals with unique phases are generated that are equally spaced in phase. In other words, any two subsequent delay cells are now spaced $nT_{REF}/P$ in time, and $360/P$ degrees in phase. The value of n may be different for different range of reference clock signal. The phase difference between any two adjacent delay outputs of the delay line 105 is constant. In an embodiment of the invention, a unique mapping ensuring the phases spaced at $2*pi/P$ exists when $2*pi*n/P$ phases are generated by dividing the reference clock by coprime number p and locking to n number of cycles.

Figure 6:
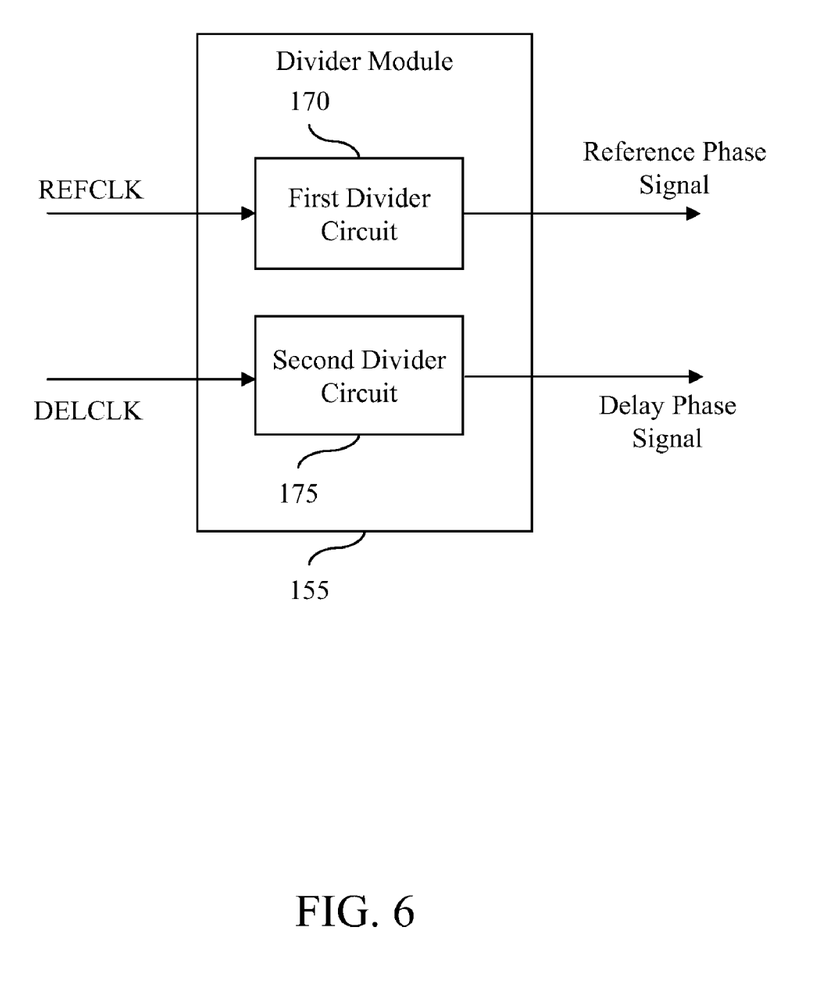
FIG. 6 is a block diagram illustrating a divider module in accordance with an embodiment of the invention.

FIG. 6 is a block diagram illustrating the divider module 155 in accordance with an embodiment of the invention. The divider module 155 includes a first divider circuit 170 and a second divider circuit 175. The first divider circuit 170 divides the REFCLK frequency by n to generate a reference phase signal, and the second divider circuit 175 divides the DELCLK frequency by n to generate a delay phase signal. Examples of the first and second divider circuits 170 and 175 include but are not limited to digital counters.

Figure 7:
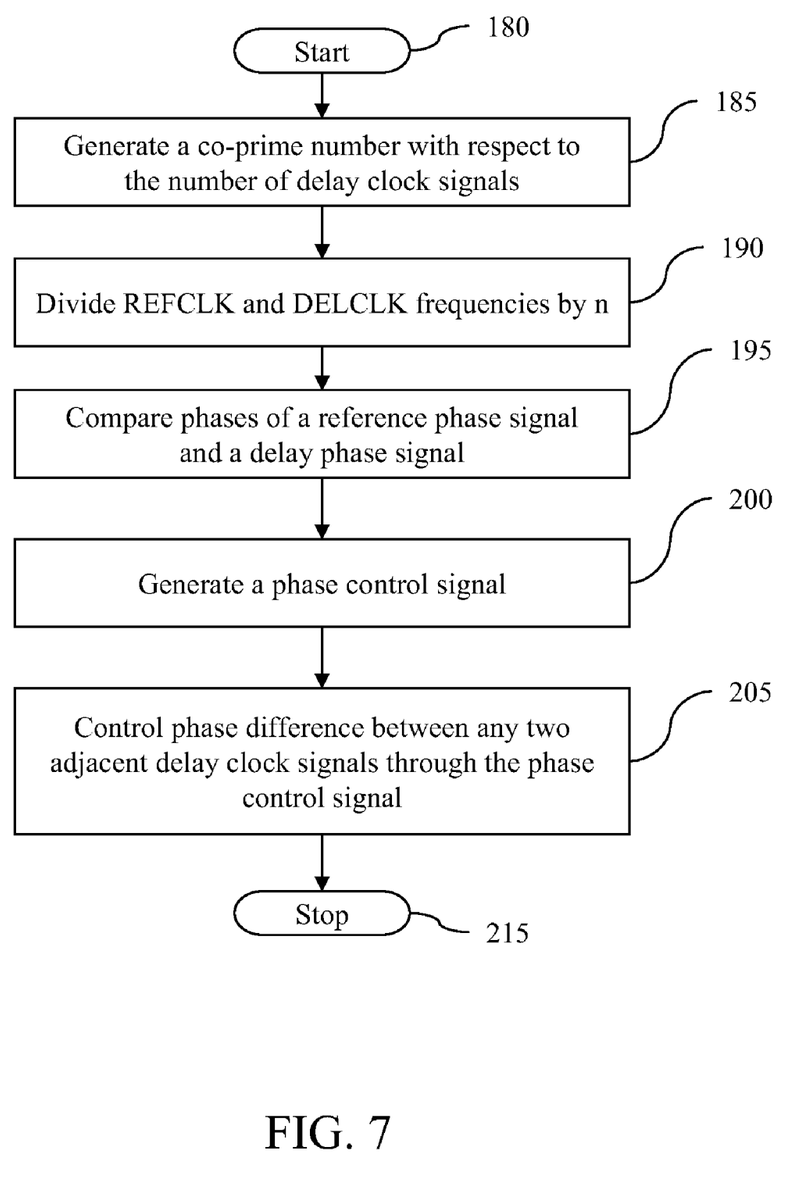
FIG. 7 is a flowchart illustrating a method for generating multiple equal-spaced phases in accordance with an embodiment of the invention.

FIG. 7 is a flowchart illustrating the method for generating multiple equal-spaced phases using the DLL 100. Step 180 starts. Step 185 generates the n-value. Step 190 divides the REFECLK and DELCLK frequencies by the n-value to generate the reference phase signal and the delay phase signal respectively. Step 195 compares the phases of the reference phase signal and the delay phase signal. Step 200 generates the phase control signal. The phase control signal is generated based on the comparison of the phases of the reference phase signal and the delay phase signal. Step 205 applies the phase control signal to the delay line 105 for controlling the phase difference between any two adjacent delay clock signals of the plurality of delay clock signals and hence, generating the plurality of equal spaced phases, i.e. P equal-spaced phases. Step 210 stops. In an embodiment of the invention, before step 210 a mapping for the required phases is generated from the existing phases based on the coprime numbers. For example, with 5 delay cells, the DLL can generate phases 72, 144, 216, 288 and 360 degrees. For each value of the co-prime number n, there exists a unique mapping of the output of the delay cells and the phase it generates.

For n=1, the phase mapping is
Del1==72
Del2==144
Del3==216
Del4==288
Del5==360

For n=3, the phase mapping is
Del2==72
Del4==144
Del1==216
Del3==288
Del5==360 where Del implies a delay cell.

So, each of these phases can be generated by selecting the output of the appropriate delay cell.

In an embodiment of the invention, at step 195 the phases of the reference clock signal and the final delay clock signal may also be compared.

In an embodiment of the invention, generating multiple phases of a reference clock signal for wide frequency range is achieved by locking to n cycles of the reference clock signal where n is co prime to a number of required clock signal phases. Locking to the n cycles of the reference clock signal is implemented by dividing the reference clock signal and a final delayed clock signal from the delay line and giving these two signals to the Phase Frequency Detector (PFD). The delay line still gets undivided reference clock as its input. Depending on the coprime number, unique mapping of the existing phases of the DLL to the required phases is done to ensure the availability of the required phases.

The method described above includes different steps involved. The method may include a greater or a fewer number of steps than those included in FIG. 7.

The DLL 100 as described earlier in accordance with embodiments of the invention introduces an additional delay '$(n-1)T_{REF}$' in the delay line 105 compared to existing multiphase DLLs, thereby relaxing the minimum delay requirement of each delay cell of the delay line 105, and resulting in reduced power consumption. Also, the value of n depends on frequency of the REFCLK, i.e., for a low REFCLK frequency, the value of n will be low and for a high REFCLK frequency the value of n will be high. Therefore, the maximum delay requirement that is supported by the DLL 100 also reduces. Since, both the minimum and maximum delay requirements are relaxed, the DLL 100 is capable of supporting a wide range of input frequencies with significant reduction in power consumption. Further, the PFD 160 is operated at a reduced frequency which also results in power savings.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

The invention claimed is:

1. A Delay Locked Loop (DLL) with equally spaced phases over a wide frequency range, the DLL comprising:
   a delay line for receiving a reference clock signal and outputting a final delay clock signal in response to the reference clock signal, wherein the delay line includes a plurality of delay cells connected in series, the plurality of delay cells generating a plurality of delay clock signals having equally spaced phases;

a control module coupled to the delay line, for generating a phase control signal based on counting a number of pulses of the reference clock signal that are input to the delay line before occurrence of a first corresponding pulse of the final delay clock signal, the control module comprising:

a calibration module for generating a co-prime number with respect to the plurality of delay clock signals, wherein the co-prime number is generated based on counting the number of pulses of the reference clock signal, the calibration module comprising:

a counter for counting the number of pulses of the reference clock signal;

a decoder coupled to the counter, for generating the co-prime number by decoding a count of the number of pulses of the reference clock signal;

a masking module for masking edges of the reference clock signal and the final delay clock signal; and a phase control module coupled to the calibration module, for generating the phase control signal based on a value of the co-prime number.

2. The DLL of claim 1, wherein the masking module masks the edges of the reference clock signal and the final delay clock signal for a pre-defined time interval.

3. The DLL of claim 1, wherein the masking module masks the edges of the reference clock signal and the final delay clock signal for a pre-defined number of edges of the reference clock signal and the final delay clock signal.

4. The DLL of claim 1, wherein the masking module comprises:

a first mask module for masking the edges of the reference clock signal, wherein the first mask module generates a 'start_count' signal on masking the edges of the reference clock signal; and a second mask module for masking the edges of the final delay clock signal, wherein the second mask module generates a 'stop_count' signal on occurrence of the first corresponding pulse of the final delay clock signal.

5. The DLL of claim 4, wherein the counter counts the number of pulses of the reference clock signal based on the start_count signal and the stop_count signal.

6. A Delay Locked Loop (DLL) with equally spaced phases over a wide frequency range, the DLL comprising:

a calibration module that generates a number, wherein the number and a count of a delay clock signal for an interval of time are co-prime to each other;

a phase control module responsive to a reference clock signal, the delay clock signal, and the number, and to generate a phase control signal based on a value of the number, the phase control module comprising:

a divider module for dividing frequency of the reference clock signal and a final delay clock signal by the number;

a Phase Frequency Detector (PFD) coupled to the divider module, for comparing phases of the reference clock signal and the final delay clock signal; and a charge pump coupled to the PFD, for generating the phase control signal based on comparing the phases of the reference clock signal and the final delay clock signal.

7. The DLL of claim 6, wherein the divider module comprises:

a first divider circuit for dividing the frequency of the reference clock signal by the number; and a second divider circuit for dividing the frequency of the final delay clock signal by the number.

8. A Delay Locked Loop (DLL) with equally spaced phases over a wide frequency range, wherein the DLL receives a reference clock signal and outputs a plurality of delay clock signals such that a phase difference between any two adjacent delay clock signals of the plurality of delay clock signals is equal, the plurality of delay clock signals including a final delay clock signal, the DLL comprising:

a masking module for masking a pre-defined number of edges of the reference clock signal and the final delay clock signal, and generating a start_count signal and a stop_count signal upon masking the pre-defined number of edges of the reference clock signal and the final delay clock signal respectively;

a counter coupled to the masking module, for generating a count of a number of pulses of the reference clock signal that are input to the delay line between inputting a pulse of the reference clock signal to the delay line and occurrence of a corresponding pulse of the final delay clock signal;

a decoder coupled to the counter, for decoding the count to generate a co-prime number with respect to a number of delay clock signals in the plurality of delay clock signals;

a divider module coupled to the decoder, for receiving a value of the co-prime number, and dividing frequencies of the reference clock signal and the final delay clock signal by the co-prime number to generate a reference phase signal and a delay phase signal respectively;

a Phase Frequency Detector (PFD) coupled to the divider module, for comparing the reference phase signal and the delay phase signal in terms of phase;

a charge pump coupled to the PFD, for generating a phase control signal based on comparing the reference phase signal and the delay phase signal; and a delay line coupled to the charge pump, wherein the delay line includes a plurality of delay cells connected in series, the plurality of delay cells generating the plurality of delay clock signals on receiving the phase control signal.

9. The DLL of claim 8, wherein the masking module comprises:

a first mask module for masking the pre-defined number of edges of the reference clock signal; and a second mask module for masking the pre-defined number of edges of the final delay clock signal.

10. The DLL of claim 8, wherein the divider module comprises:

a first divider circuit for dividing the frequency of the reference clock signal by the co-prime number to generate the reference phase signal; and a second divider circuit for dividing the frequency of the final delay clock signal by the co-prime number to generate the delay phase signal.

11. A method for generating a plurality of equal-spaced phases with a wide frequency range using a Delay Locked Loop (DLL), the DLL including a plurality of delay cells connected in series, the plurality of delay cells generating a plurality of delay clock signals in response to a reference clock signal, the plurality of delay clock signals including a final delay clock signal, the method comprising:

generating a number, wherein the number and a count of a delay clock signal for an interval of time are co-prime to each other;

dividing a frequency of the reference clock signal and the final delay clock signal by the number to generate a reference phase signal and a delay phase signal respectively;

comparing phases of the reference phase signal and the delay phase signal;

generating a phase control signal based on comparing the phases; and controlling a phase difference between any two adjacent delay clock signals of the plurality of delay clock signals through the phase control signal for generating the plurality of equal-spaced phases.

12. The method of claim 11, wherein generating the number comprises:

generating a count of a number of pulses of the reference clock signal that are input to the plurality of delay cells before occurrence of a first corresponding pulse of the final delay clock signal;

decoding the count to generate a count value;

outputting the count value when the count is co-prime to the count of the final delay clock signal; and outputting a next number greater than the count value, wherein the next number is co-prime to the number of delay clock signals in the plurality of delay clock signals when the count is not co-prime to the number of delay clock signals.

13. The method of claim 11, wherein generating the number further comprises masking edges of the reference clock signal and the final delay clock signal.

* * * * *